(12) United States Patent
Vo

(10) Patent No.: US 7,596,632 B1
(45) Date of Patent: Sep. 29, 2009

(54) WINDOWING BY PREFIX MATCHING

(75) Inventor: Kiem-Phong Vo, Berkeley Heights, NJ (US)

(73) Assignee: AT&T Intellectual Property II, L.P., Reno, NV (US)

(*) Notice: Subject to any disclaimer, the term of this patent is extended or adjusted under 35 U.S.C. 154(b) by 647 days.

(21) Appl. No.: 11/243,923

(22) Filed: Oct. 5, 2005

Related U.S. Application Data

(60) Provisional application No. 60/615,904, filed on Oct. 5, 2004.

(51) Int. Cl.
*G06F 15/16* (2006.01)
(52) U.S. Cl. .................................. 709/247; 709/246
(58) Field of Classification Search ............. 709/247, 709/246
See application file for complete search history.

(56) References Cited

U.S. PATENT DOCUMENTS

| | | | | |
|---|---|---|---|---|
| 6,018,747 A | * | 1/2000 | Burns et al. | 707/203 |
| 6,374,250 B2 | * | 4/2002 | Ajtai et al. | 707/101 |
| 7,320,009 B1 | * | 1/2008 | Srivastava et al. | 707/104.1 |
| 2002/0010702 A1 | * | 1/2002 | Ajtai et al. | 707/101 |
| 2005/0055367 A1 | | 3/2005 | Vo et al. | |

OTHER PUBLICATIONS

Korn et al., The VCDIFF Generic Differencing and Compression Data Format, Jun. 2002, retrieved from http://tools.ietf.org/rfc/rfc3284.txt.*

* cited by examiner

*Primary Examiner*—Joon H Hwang
*Assistant Examiner*—Chau D Le
(74) *Attorney, Agent, or Firm*—Hoffmann & Baron, LLP

(57) ABSTRACT

A method for computing matching windows for delta compression. The method computes pairs of matching source and target data segments irrespective of target data segment size or file offset. The method includes (1) representing a large source data file by a sequence of fixed-size segments; (2) computing a signature for each data segment using its contents such that, with a strong likelihood, two segments are the same if their signatures match; (3) parsing target data using a prefix matching method on such a sequence of signatures of source data to compute matching sequences of segments; and (4) merging closely matched segments as necessary to form matching windows.

23 Claims, 5 Drawing Sheets

FIG. 3B

```
1.  bestm = -1; bestl = 0;
2.  for each m such that s[m] = d[0]
3.  {      for (l = 0; m+l < a && l*n < b; ++l)
4.              if (s[m+l] != d[l*n])
5.                  break;
6.          if(l > bestl)
7.          {   bestl = l;
8.              bestm = m;
9.          }
10. {
```

WINDOWING BY PREFIX MATCHING

CROSS-REFERENCE TO RELATED APPLICATIONS

This application claims the benefit of U.S. Provisional Patent Application Ser. No. 60/615,904, filed on Oct. 5, 2004, which is incorporated herein by reference.

TECHNICAL FIELD

The present invention generally relates to data compression, and more particularly to windowing techniques for delta compression.

BACKGROUND OF THE INVENTION

Due to limited computing resource, compression programs routinely limit large quantities of data to be compressed together in smaller segments called windows. The process of doing this is called windowing. In delta compression, a target file is compressed given some related source file. For large files, the windowing process is done by first dividing the target file into target windows, then compressing each such target window against some source window. The source window is often derived from a source file but also may be derived from some part of the target file that precedes the current target window.

Typically, delta compressors select window sizes so that data structures can be built and manipulated entirely in main memory of a computer. In fact, delta compressors typically use fixed-size windows. In addition, delta compressors often use matching file offsets for processing source and target windows. Using matching file offsets works well if there are small changes between source and target files but when more extensive changes are present, the compression rate in which the file is compressed can decline greatly. Although a brute force approach to finding matching windows may be used to align a target window with every location in a source file, this technique tends to be very slow and inefficient.

In U.S. patent application Ser. No. 10/894,421 entitled "Method and Apparatus for windowing in Entropy Encoding", Vo et al. disclose a windowing technique based on n-grams to find matching windows with similarity regardless of file offsets. Although the techniques disclosed in that application may be used on large classes of data, the techniques employ fixed size windows that are sensitive to the matched lengths of data across source and target files. For example, if the window size is established too large, the window matching algorithm may not find any matching windows since none will be similar. Alternatively, if the window size is established too small, the compression rate will not be as good as that which could be achieved.

As a result, there is a need to for a computational efficient technique for data compression irrespective of window size or file offsets.

SUMMARY OF THE INVENTION

Techniques are disclosed for computing matching windows that show significant improvement over the performance of methods based on entropy encoding. The techniques disclosed are based on the following main steps: (1) representing a large source data file by a sequence of fixed-size segments; (2) computing a signature for each segment using its contents such that, with a strong likelihood, two segments are the same if their signatures match; (3) parsing target data using a prefix matching method on such a sequence of signatures of source data to compute matching sequences of segments; and (4) merging closely matched segments as necessary to form matching windows.

A system, as well as articles that include a machine-readable medium storing machine-readable instructions for implementing the various techniques, are disclosed. Details of various embodiments are discussed in greater detail below.

In some embodiments, one or more of the following advantages may be present. For example, the disclosed techniques may allow a data compressor to compress files regardless of file offsets efficiently.

An additional benefit of the system may relate to the selection of window sizes. For example, data compressors utilizing the disclosed techniques need not establish fixed size windows to operate effectively.

Additional features and advantages will be readily apparent from the following detailed description, the accompanying drawings and the claims.

BRIEF DESCRIPTION OF THE DRAWINGS

FIGS. 3a-b illustrate a method and software code, respectively, for determining a best matching prefix.

Like reference symbols in the various drawings indicate like elements.

DETAILED DESCRIPTION OF THE PREFERRED EMBODIMENT

Figure 1:
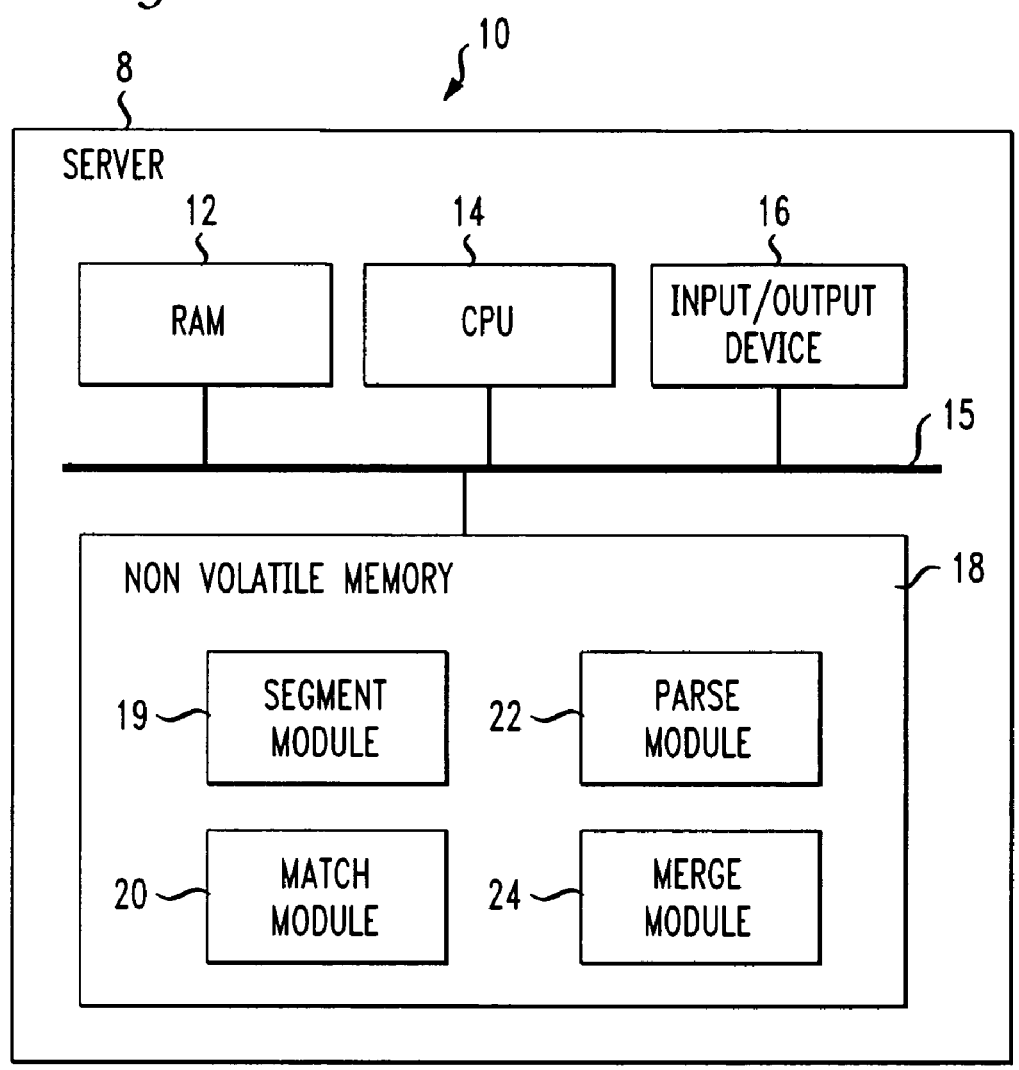
FIG. 1 illustrates a block diagram of a computer system according to the present invention.

FIG. 1 is a schematic block diagram that illustrates a computer system 10 configured to include program modules operable in accordance with the present. As shown in FIG. 1, a server 8 is provided that includes a central processing unit (CPU) 14, an input-output device 16, a random access volatile memory (RAM) 12, and non-volatile memory 18 all of which are preferably interconnected via a common bus 15 and controlled by the CPU 14. The server 8 also may include a nonvolatile storage device such as a hard disk drive (not shown) and a CD ROM drive (not shown).

As shown in FIG. 1, the non-volatile memory 18 of the server 8 is configured to include a segment module 19, a match module 20, a parse module 22 and a merge module 24.

In a preferred embodiment, the segment module 20 is configured to compute signatures for any given data segment P. various techniques are disclosed in the art for generating digital signatures (e.g., checksum) for data sequences. The present invention, however, is not limited to any one particular type of digital signature technique.

The present invention is configured to compute a signature for a first data segment s(P) based on the content of the data segment P such that, with strong likelihood, s(P)=s(Q), wherein s(Q) represents a particular second data segment.

Figure 2:
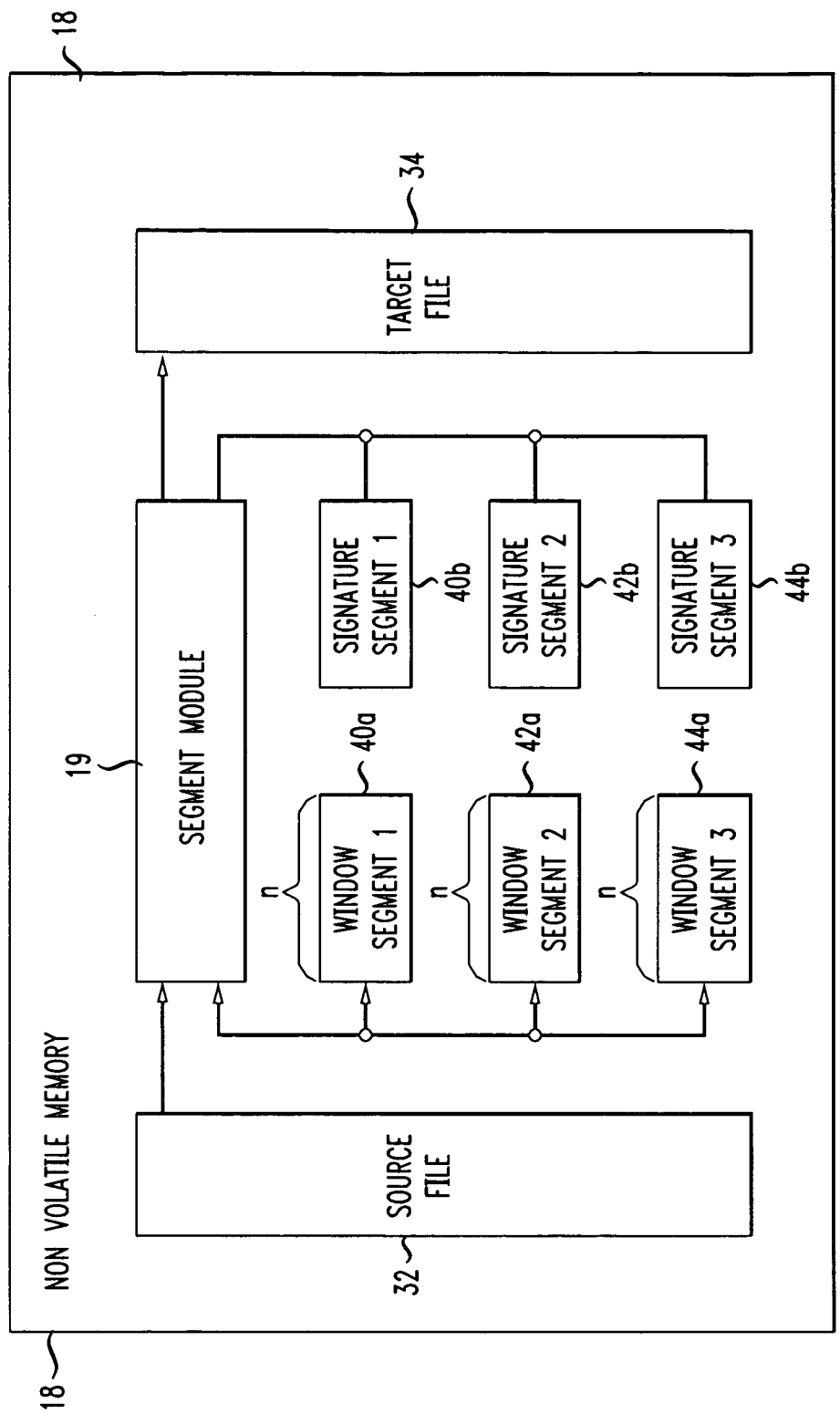
FIG. 2 illustrates a source data file divided into source data segments.

For example, referring now to FIG. 2, in a preferred embodiment, the segment module 19 of the present invention accesses a source file S 32, and a target file T 34, and a variable n for storing a minimal value (e.g., 1000 bytes). As shown in FIG. 2, the segment module 20 divides the source file into a sequence of data segments 40a, 42a, 44a $S_0, S_1, \ldots, S_a$, each of a size as defined in variable n. In one embodiment, as shown in FIG. 2, the last data segment 46 may be omitted if its length is shorter than the value stored in n. Next, for each data segment generated 40a, 42a, 44a, the segment module 19 generates a corresponding signature 40b, 42b, 44b. For example, in one preferred embodiment, the segment module may generate a checksum for each data segment generated.

Referring back to FIG. 1, the match module 20 is provided and determines a prefix of a first data segment that is best matching to a second data segment. For explanatory purposes, source data file S is represented by a corresponding sequence of signatures $s(S_i)$'s, $s[_0], s[_1], \ldots, s[_a]$ to denote the sequence of signatures generated by the segment module 19, D references any data sequence of a length b>n, and the term d[k] denotes the signature of a data segment of length n starting from a location k in D.

Figure 3A:
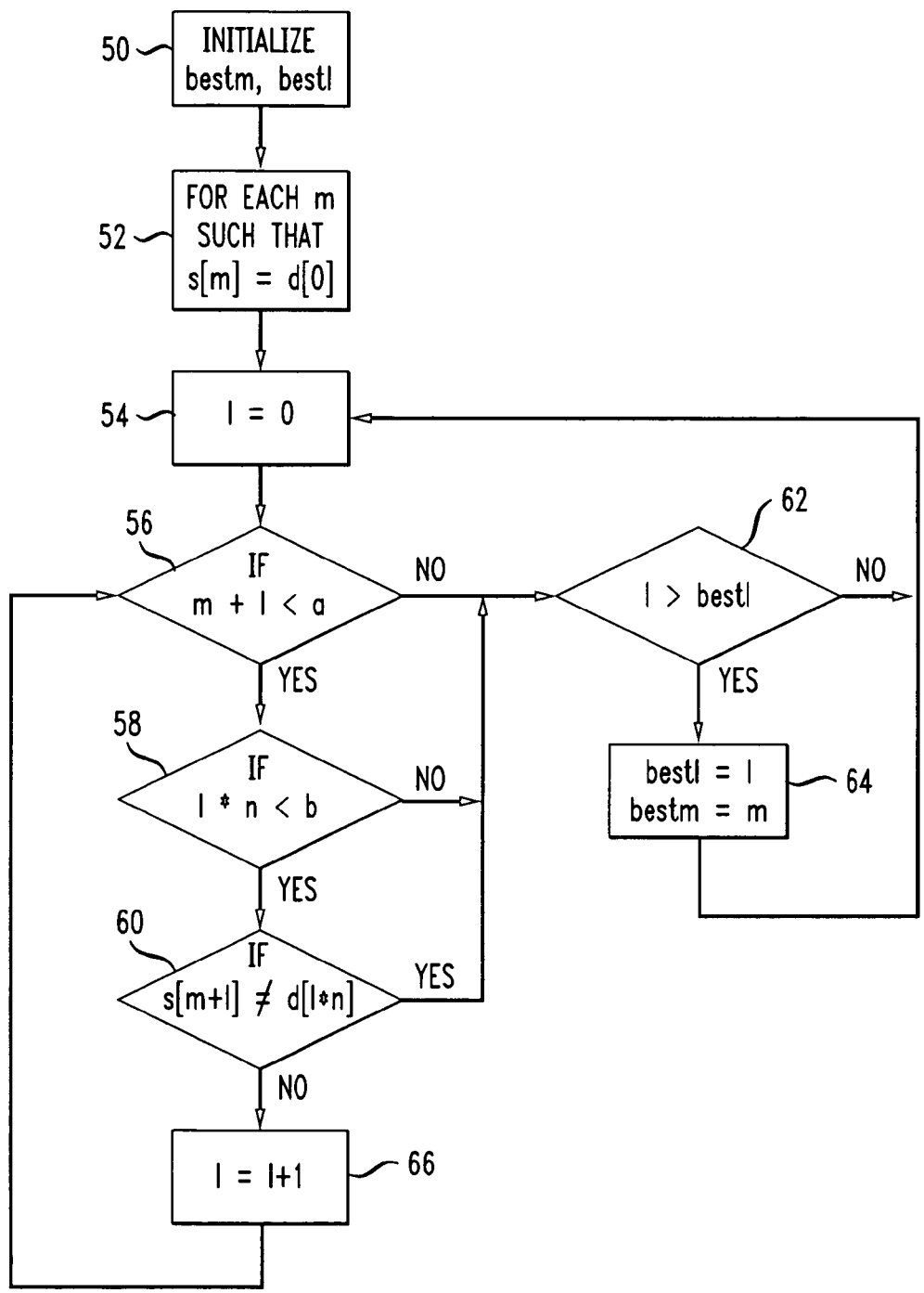

Referring now to FIG. 3a, a method executed by the match module 20 that is used for prefix matching is disclosed. First, as shown in FIG. 3a, in one preferred embodiment, two variables bestm, bestl 50 are established in memory and are initialized to −1 and 0, respectively. The match module 20 uses the bestm variable to store the location of a match in S and the bestl variable to store the length of the match in S. Next, for each m (e.g., a relative position in S), such that s[m]=d[0], the match module 20 executes the following steps 52. The match module 20 establishes a memory variable l that is initialized to zero 54. Next, the match module 20 determines if the position in S+1 is less than the total number of segments 56 and whether the contents of variable l multiplied by the size of the segment is less than the value stored in variable b 58. If either condition 56, 58 is determined to be false, the match module 20 determines whether the value stored in the variable l is greater than the value stored in the variable bestl 62. If the value of variable l is greater than the value stored in the variable bestl, the match module 20 assigns the value stored in variable l to the bestl variable and assigns the value stored in variable m to the bestm variable 54. The match module 20 then reinitializes the variable l to zero as shown in step 54. If the value of variable l is less than or equal to the value stored in the bestl variable, the match module 20 reinitializes the variable l to zero as shown in step 54.

If the match module 20 determines that both conditions identified at steps 56 and 58 are true, the match module 20 increments the variable l by one 66 and determines whether the position in S is less than the total number of segments 56. In a preferred embodiment, output of the match module 20 is a pair (bestm, bestl) of values (e.g., a prefix) that identifies the location of the match in S and the length of the match, respectively. FIG. 3b shows software code that executes the above algorithm in accordance with the present invention.

Figure 4:
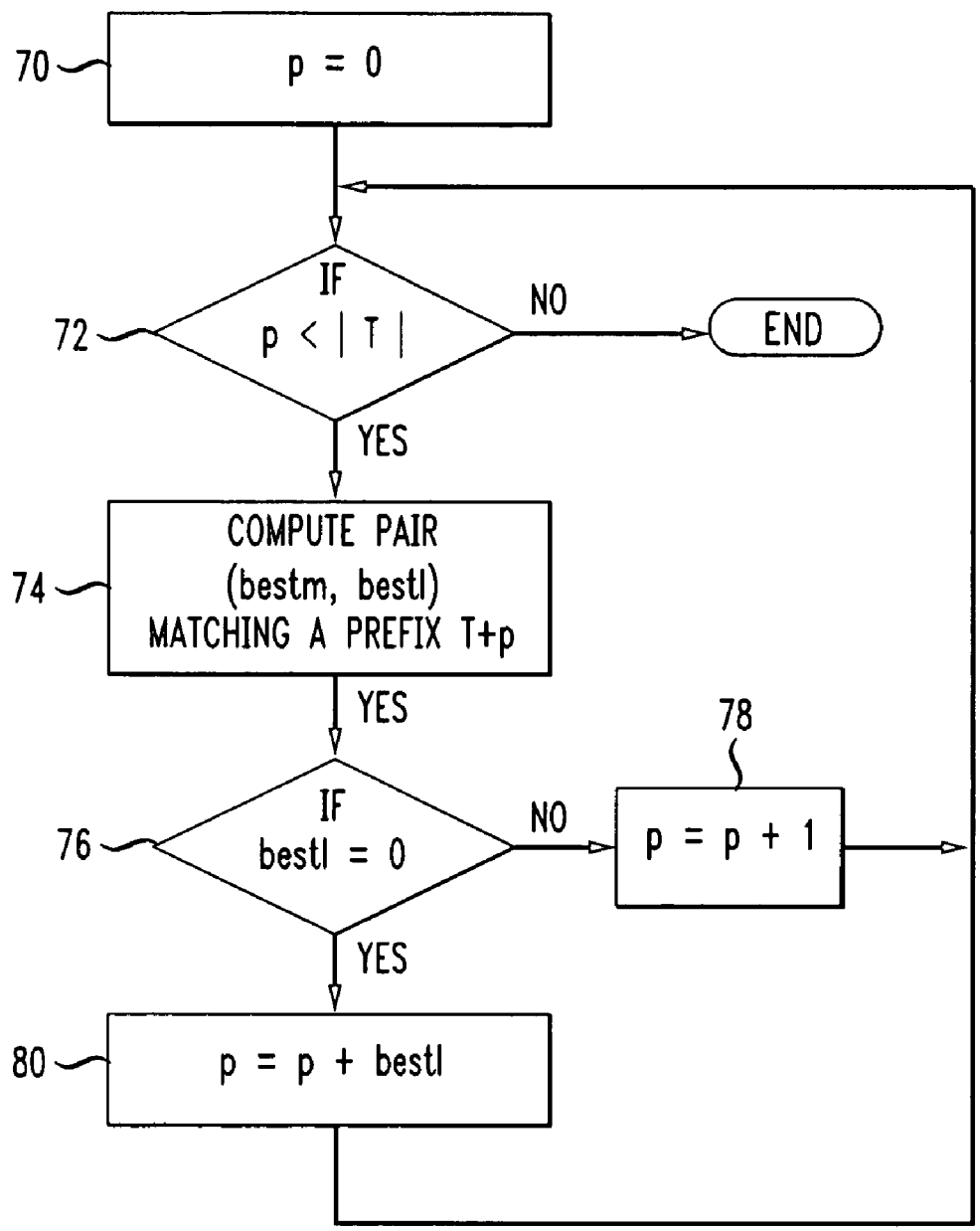
FIG. 4 illustrates a method for parsing data from a target file.

The parse module 22 is provided and computes a pair of values that best match a suffix of a target data segment starting at a particular position p. For example, in one preferred embodiment, as shown in FIG. 4, the parse module 22 executes the following method. First, the parse module 22 establishes a memory variable p representing a data segment position which is initialized to zero 70. Next, the parse module 22 determines whether the value stored in variable p is less than an absolute value calculated for the target file T 72. If the value of variable p is less than the absolute value of T, the parse module 22 computes the pair (bestm, bestl) matching a prefix T+p 74. If the bestl variable equals zero 76 indicating a match, the parse module 22 increments the value of p by the value stored in the bestl variable 80 and proceeds to step 72. Otherwise, the parse module 22 increments the variable p 78 by one and proceeds to step 72.

During execution of the above process, in one preferred embodiment, the parse module 22 constructs a sequence of triples $(p_1, m_1, l_1)$ $(p_2, m_2, l_2) \ldots (p_k, m_k, l_k)$ where each $p_i$ is a position in T, the target file, $m_i$ is a position in and $l_i>0$ is the length of the match between the target T and source S at the given positions.

Referring back to FIG. 1, the merge module 24 is provided that merges adjacent triples generated by the parse module 22. The merge module 22 determines if the triples are close to each other in the target file and whether their matching segments overlap within a particular tolerance. For example, in one preferred embodiment, the merge module 24 establishes a memory variable o with a small size (e.g., 1000 bytes). The merge module 24 then determines whether two adjacent triples $(p_i, m_i, l_i)$ and $(p_i+1, m_i+1, l_i+1)$ are mergeable if $p_i+1<=p_i+l_i+o$, and $m_i+1<=m_i+l_i+o$ and $m_i+1+l_i+1>=m_i-o$. Thus, the merge module 24 merges two adjacent triples if they are close to each other in the target file T and their matching segments overlap within the tolerance level stored in memory variable o.

Once two mergeable triples are identified, the merge module 24 may then calculate minimum and maximum values for merging two triples into a single one. For example, the merge module 24 may establish a memory variable m and calculate a value for m that is the minimum of $(m_i, m_{i+1})$. The merge module 24 also may establish a memory variable M and calculate a value for M that is the maximum of $(m_i+l_i, m_{i+1}+l_{i+1})$. The merger module 24 then may merge the two triples into a single one $(p_i, m, M-m)$.

In a preferred embodiment, the merge module 24 may perform the above merging procedure repeatedly on the sequence of triples until no adjacent pairs of triples are mergeable. Between each pair of unmergeable triples, there may be a gap of data in the target file T not matchable with source data. In one embodiment, for example, the merge module 24 maybe configured to merge the data into either a left triple or a right triple, if the gap meets a particular threshold (e.g., with length <o). In another preferred embodiment, the merge module 24 may leave the data as unmatched. In the latter preferred embodiment, the merge module 24 may partition the target file T into a sequence of regions, each corresponding to a triple or a gap and each region defining a window of data in the target file T. Employing such techniques may ensure that each region corresponding to a triple has as its matching source window the source area defined by its triple.

The techniques disclosed are based on the following main steps: (1) representing a large source data file by a sequence of fixed-size segments; (2) computing a signature for each segment using its contents such that, with a strong likelihood, two segments are the same if their signatures match; (3) parsing target data using a prefix matching method on such a sequence of signatures of source data to compute matching sequences of segments; and (4) merging closely matched segments as necessary to form matching windows.

The present invention computes pairs of matching source and target data segments irrespective of data segment size or file offset. The techniques disclosed may be used to compute a signature for a given target data segment using content of the target data segment such that, with a strong likelihood, the signature of the target data segment is equivalent to a signature of a related source data segment if the contents of the target data segment and source data segment are equivalent.

Various aspects of the system relate to identifying prefixes in a data sequence, parsing data from a data sequence and merging data from a data sequence. For example, according to one aspect, a method includes determining a prefix for a first data segment that matches a second data segment using a prefix matching algorithm, computing a position value that matches a suffix of the second data segment to the prefix and merging data from the first data segment into the second data segment using the position value.

In some embodiments, the method also may include comparing a signature of the first data segment to a signature of the second data segment, and determining the prefix match based on the comparison.

In yet other embodiments, the method also may include generating a checksum for the first data segment and the second data segment.

Various features of the system may be implemented in hardware, software, or a combination of hardware and software. For example, some features of the system may be implemented in one or more computer programs executing on programmable computers. In addition, each such computer program may be stored on a storage medium such as read-only-memory (ROM) readable by a general or special purpose programmable computer or processor, for configuring and operating the computer to perform the functions described above.

Although preferred embodiments of the present invention have been described herein with reference to the accompanying drawings, it is to be understood that the invention is not limited to those precise embodiments and that various other changes and modifications may be affected herein by one skilled in the art without departing from the scope or spirit of the invention, and that it is intended to claim all such changes and modifications that fall within the scope of the invention.

What is claimed is:

1. A method of matching target file data with source file data for delta compression, the method comprising:
    computing a source signature for each of a plurality of source file data segments, the plurality of source file data segments generated by partitioning a source file;
    computing a target signature for each of a plurality of target file data segments, the plurality of target file data segments generated by partitioning a target file;
    generating a plurality of match identifiers, each of the plurality of match identifiers being generated based on a comparison of one of the plurality of source signatures with one of the plurality of target signatures using a prefix matching algorithm, each of the plurality of match identifiers representing a match of data between the target file and the source file, each of the plurality of match identifiers including a triple of information that includes a position of the match in the target file, a position of the match in the source file and a length of the match at the positions of the target file and the source file; and
    merging at least a first match identifier representing a first match of data and a second match identifier representing a second match of data into a single match identifier of the plurality of match identifiers based at least on a tolerance factor of one byte or greater overlapping the end of the first match of data and the beginning of the second match of data between the target file and the source file.

2. The method of claim 1 further comprising delta-compressing target file data based on the plurality of match identifiers a delta compressor.

3. The method of claim 1 wherein merging includes determining a position in the target file, a position in the source file and a length representing merged matches of data between the target file and the source file.

4. The method of claim 1 comprising dividing at least one of the source file and the target file into equal length data segments.

5. The method of claim 1 wherein generating each of the match identifiers comprises determining the position in the target file, the position in the source file and the length of the match between the source file and the target file at the positions.

6. The method of claim 1 comprising generating a checksum for at least one of the source file data segments and the target file data segments.

7. The method of claim 1 wherein merging includes merging unmatchable data between the first match of data and the second match of data into the single match identifier if length of the unmatchable data is within the tolerance factor.

8. The method of claim 7 wherein merging unmatchable data between the first match of data and the second match of data into the single match identifier comprises determining a position in the target file, a position in the source file and a length representing merged matches of data and the unmatchable data.

9. An article comprising a storage medium storing machine-readable instructions that, when applied to a machine, cause the machine to:
    compute a source signature for each of a plurality of source file data segments, the plurality of source file data segments generated by partitioning a source file;
    compute a target signature for each of a plurality of target file data segments, the plurality of target file data segments generated by partitioning a target file;
    generate a plurality of match identifiers, each of the plurality of match identifiers being generated based on a comparison of one of the plurality of source signatures with one of the plurality of target signatures using a prefix matching algorithm, each of the plurality of match identifiers representing a match of data between the target file and the source file, each of the plurality of match identifiers including a triple of information that includes a position of the match in the target file, a position of the match in the source file and a length of the match at the positions of the target file and the source file; and
    merge at least a first match identifier representing a first match of data and a second match identifier representing a second match of data into a single match identifier of the plurality of match identifiers based at least on a tolerance factor of one byte or greater overlapping the end of the first match of data and the beginning of the second match of data between the target file and the source file.

10. The article of claim 9 including instructions that, when applied to the machine, cause the machine to delta-compress target file data based on the plurality of match identifiers using a delta compressor.

11. The article of claim 9 wherein instructions that cause the machine to merge comprise instructions that, where applied to the machine, cause the machine to determine a position in the target file, a position in the source file and a length representing merged matches of data between the target file and the source file.

12. The article of claim 9 including instructions that, when applied to the machine, cause the machine to divide at least one of the source file and the target file into equal length data segments.

13. The article of claim 9 including instructions that, when applied to the machine, cause the machine to generate a checksum for at least one of the source file data segments and the target file data segments.

14. The article of claim 9 wherein instructions that cause the machine to generate the plurality of match identifiers include instructions that, when applied to the machine, cause the machine to determine the position in the target file, the position in the source file and the length of the match between the source file and the target file at the positions for each of the plurality of match identifiers.

15. The article of claim 9 wherein instructions that cause the machine to merge comprise instructions that, where applied to the machine, cause the machine to merge unmatchable data between the first match of data and the second match of data into the single match identifier if length of the unmatchable data is within the tolerance factor.

16. The article of claim 15 wherein instructions that cause the machine to merge unmatchable data comprise instructions that, when applied to the machine, cause the machine to determine a position in the target file, a position in the source file and a length representing merged matches of data and the unmatchable data.

17. A computer system to match target file data with source file data for delta compression, the computer system including a processing device comprising:
- a segment module to compute a source signature for each of a plurality of source file data segments associated with a source file and to compute a target signature for each of a plurality of target file data segments associated with a target file; and
- a parse module to generate a plurality of match identifiers, each of the plurality of match identifiers being generated based on a comparison of one of the plurality of source signatures with one of the plurality of target signatures using a prefix matching algorithm, each of the plurality of match identifiers representing a match of data between the target file and the source file, each of the plurality of match identifiers including a triple of information that includes a position of the match in the target file, a position of the match in the source file and a length of the match at the positions of the target file and the source file; and
- a merge module to merge at least a first match identifier representing a first match of data and a second match identifier representing a second match of data into a single match identifier of the plurality of match identifiers based at least on a tolerance factor of one byte or greater overlapping the end of the first match of data and the beginning of the second match of data between the target file and the source file.

18. The computer system of claim 17 further comprising a delta compressor to delta-compress the target file based on the plurality of match identifiers.

19. The computer system of claim 17 wherein the merge module is further to determine a position in the target file, a position in the source file and a length representing merged matches of data between the target file and the source file for the single match identifier.

20. The computer system of claim 17 wherein the segment module is further to to divide at least one of the source file and the target file into equal length data segments.

21. The computer system of claim 17 wherein the parse module is further to determine the position in the target file, the position in the source file and the length of the match between the source file and the target file at the positions.

22. The computer system of claim 17 wherein the merge module is further to merge unmatchable data between the first match of data and the second match of data into the single match identifier if length of the unmatchable data is within the tolerance factor.

23. The computer system of claim 22 wherein the merge module is further to determine a position in the target file, a position in the source file and a length representing merged matches of data and the unmatchable data.

* * * * *